(12) United States Patent
Wang

(10) Patent No.: US 11,925,039 B2
(45) Date of Patent: Mar. 5, 2024

(54) OPTICAL-SENSING DEVICE, MANUFACTURING METHOD THEREOF, AND DISPLAY PANEL

(71) Applicant: Shenzhen China Star Optoelectronics Semiconductor Display Technology Co., Ltd., Guangdong (CN)

(72) Inventor: Haijun Wang, Guangdong (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 562 days.

(21) Appl. No.: 16/972,627

(22) PCT Filed: Nov. 17, 2020

(86) PCT No.: PCT/CN2020/129324
§ 371 (c)(1),
(2) Date: Dec. 7, 2020

(87) PCT Pub. No.: WO2022/048022
PCT Pub. Date: Mar. 10, 2022

(65) Prior Publication Data
US 2022/0359619 A1 Nov. 10, 2022

(30) Foreign Application Priority Data
Sep. 7, 2020 (CN) .......................... 202010927547.1

(51) Int. Cl.
*H01L 27/30* (2006.01)
*H10K 39/30* (2023.01)
(Continued)

(52) U.S. Cl.
CPC ......... *H10K 39/30* (2023.02); *G02F 1/13312* (2021.01); *H10K 30/10* (2023.02); *H10K 30/354* (2023.02)

(58) Field of Classification Search
CPC ..... H01L 31/06–078; H01L 31/10–119; H01L 31/1129; H01L 51/428;
(Continued)

(56) References Cited

U.S. PATENT DOCUMENTS

| | | | | |
|---|---|---|---|---|
| 8,928,053 B2* | 1/2015 | Kurokawa | ............... | G06F 3/041 257/292 |
| 2020/0133414 A1* | 4/2020 | Lee | .......................... | G06F 3/044 |

(Continued)

FOREIGN PATENT DOCUMENTS

| | | | | | |
|---|---|---|---|---|---|
| CN | 110993721 A | * | 4/2020 | ........... | H01L 31/032 |
| CN | 111399292 A | * | 7/2020 | ......... | G02F 1/13338 |

(Continued)

OTHER PUBLICATIONS

S. Du et al., "Organolead trihalide perovskite as light absorber for IGZO phototransistor," 2017 IEEE 12th International Conference on Nano/Micro Engineered and Molecular Systems (NEMS), Los Angeles, CA, USA, 2017, pp. 476-480, doi: 10.1109/NEMS.2017.8017067.*

(Continued)

*Primary Examiner* — Jarrett J Stark
(74) *Attorney, Agent, or Firm* — PV IP PC; Wei Te Chung; Zhigang Ma

(57) ABSTRACT

The present disclosure provides an optical-sensing device, a manufacturing method thereof, and a display panel. The optical-sensing device includes a sensor TFT disposed on a substrate and a switch TFT connected with the sensor TFT. The sensor TFT and the switch TFT include a first active layer and a second active layer, the first active layer comprises a first IGZO layer and a perovskite layer disposed on the first IGZO layer, and the second active layer comprises a second IGZO layer.

17 Claims, 4 Drawing Sheets

(51) Int. Cl.
 *G02F 1/133* (2006.01)
 *H10K 30/00* (2023.01)
 *H10K 30/10* (2023.01)

(58) Field of Classification Search
 CPC .. H01L 31/1016; H10K 39/30; H10K 30/354; H10K 10/484; G02F 1/13312
 See application file for complete search history.

(56) References Cited

U.S. PATENT DOCUMENTS

| | | | | |
|---|---|---|---|---|
| 2020/0229709 | A1* | 7/2020 | Huang | A61B 5/029 |
| 2022/0359619 | A1* | 11/2022 | Wang | H10K 39/30 |
| 2023/0082228 | A1* | 3/2023 | Leuenberger | H01L 31/1013 |
| | | | | 257/17 |
| 2023/0145517 | A1* | 5/2023 | Tedde | G01T 1/241 |
| | | | | 250/370.09 |

FOREIGN PATENT DOCUMENTS

| | | | | | |
|---|---|---|---|---|---|
| CN | 112086561 | A | * | 12/2020 | G02F 1/1362 |
| CN | 112201673 | A | * | 1/2021 | |

OTHER PUBLICATIONS

X. Liu et al., "Dual-Gate Phototransistor With Perovskite Quantum Dots-PMMA Photosensing Nanocomposite Insulator," in IEEE Electron Device Letters, vol. 38, No. 9, pp. 1270-1273, Sep. 2017, doi: 10.1109/LED.2017.2724562.*
ACS Appl. Mater. Interfaces 2018, 10, 15, 12854-12861 Publication Date:Mar. 26, 2018 https://doi.org/10.1021/acsami.8b01427.*

* cited by examiner

OPTICAL-SENSING DEVICE, MANUFACTURING METHOD THEREOF, AND DISPLAY PANEL

FIELD OF INVENTION

The present disclosure relates to the field of display technologies, and particularly relates to an optical-sensing device, a manufacturing method thereof, and a display panel.

BACKGROUND OF INVENTION

Thin film transistor-liquid crystal display (TFT-LCD) devices are widely used in current panel display industry due to characteristics of lightness, thinness, small sizes, low power consumption, no radiation, and relatively low manufacturing cost.

In order to broaden commercial and household functions of LCD devices, many functions are now integrated into display devices, such as color temperature sensing, laser sensing, gas sensing, etc., thereby improving applicable scenarios of the LCD devices. However, many integrated functions are in a new development stage, and many processes and related designs still need to be improved to improve performances of the LCD devices with various integrated functions.

Technical Problems

The present disclosure provides an optical-sensing device, a manufacturing method thereof, and a display panel, aiming at improving a photoelectric conversion efficiency of the optical-sensing device and at the same time realizing an adjustable band gap of the optical-sensing device.

Technical Solutions

In one aspect, the present disclosure provides an optical-sensing device, including:
a substrate;
a sensor thin film transistor (TFT) disposed on the substrate, the sensor TFT including a first active layer; and
a switch TFT disposed on the substrate and connected with the sensor TFT, the switch TFT including a second active layer;
wherein the first active layer includes a first indium gallium zinc oxide (IGZO) layer and a perovskite layer disposed on the first IGZO layer, and the second active layer includes a second IGZO layer.

Further preferably, the first active layer further includes a first graphene layer disposed on the first IGZO layer.

Further preferably, the second active layer further includes a second graphene layer disposed on the second IGZO layer.

Further preferably, the sensor TFT includes: a first bottom gate electrode disposed on the substrate; an insulating layer covering the first bottom gate electrode; the first active layer disposed on the insulating layer; a first source electrode and a first drain electrode disposed on the insulating layer and connected with two ends of the first active layer; and a planarization layer covering the first active layer, the first source electrode, and the first drain electrode.

Further preferably, the switch TFT includes: a second bottom gate electrode disposed on the substrate; the insulating layer covering the second bottom gate electrode; the second active layer disposed on the insulating layer; a second source electrode and a second drain electrode disposed on the insulating layer and connected with two ends of the second active layer; and the planarization layer covering the second active layer, the second source electrode, and the second drain electrode; wherein the second source electrode connects with the first drain electrode.

Further preferably, the sensor TFT further includes a first top gate electrode disposed on the planarization layer and corresponding to the first active layer.

Further preferably, the optical-sensing device further includes a storage capacitance structure disposed on the substrate, the storage capacitance structure is electrically connected with the sensor TFT and/or the switch TFT.

On another aspect, the present disclosure provides a manufacturing method of an optical-sensing device, including:
providing a substrate;
forming a first bottom gate electrode, a second bottom gate electrode, and an insulating layer on the substrate, the insulating layer covering the first bottom gate electrode and the second bottom gate electrode;
forming a first IGZO layer and a second IGZO layer on the insulating layer, the first IGZO layer and the second IGZO layer corresponding to the first bottom gate electrode and the second bottom gate electrode;
forming a perovskite layer on the first IGZO layer, wherein the first IGZO layer and the perovskite layer constitute a first active layer, and the second IGZO layer constitutes a second active layer; and
forming a patterned metal layer on the insulating layer to be a first source electrode and a first drain electrode connected with two ends of the first active layer, and to be a second source electrode and a second drain electrode connected with two ends of the second active layer, thereby forming a sensor TFT and a switch TFT connected with the sensor TFT.

Further preferably, a step of forming the perovskite layer on the first IGZO layer includes:
depositing perovskite materials on the first IGZO layer, the second IGZO layer, and the insulating layer;
preparing a photoresist layer on a portion of the perovskite materials corresponding to the first IGZO layer; and
etching the perovskite materials based on the photoresist layer to form the perovskite layer.

Further preferably, the first active layer further includes a first graphene layer disposed on the first IGZO layer.

Further preferably, the second active layer further includes a second graphene layer disposed on the second IGZO layer.

Further preferably, the manufacturing method further includes forming a planarization layer covering the patterned metal layer, the first active layer, and the second active layer.

Further preferably, the manufacturing method further includes forming a first top gate electrode on the planarization layer and corresponding to the first active layer.

On another aspect, the present disclosure provides a display panel including a liquid crystal display panel and an optical-sensing device disposed on the liquid crystal display panel as described in item 1 above, the optical-sensing device includes:
a substrate;
a sensor thin film transistor (TFT) disposed on the substrate, the sensor TFT including a first active layer; and a switch TFT disposed on the substrate and connected with the sensor TFT, the switch TFT including a second active layer;

wherein the first active layer includes a first indium gallium zinc oxide (IGZO) layer and a perovskite layer disposed on the first IGZO layer, and the second active layer includes a second IGZO layer.

Further preferably, the first active layer further includes a first graphene layer disposed on the first IGZO layer.

Further preferably, the second active layer further includes a second graphene layer disposed on the second IGZO layer.

Further preferably, the sensor TFT includes: a first bottom gate electrode disposed on the substrate; an insulating layer covering the first bottom gate electrode; the first active layer disposed on the insulating layer; a first source electrode and a first drain electrode disposed on the insulating layer and connected with two ends of the first active layer; and a planarization layer covering the first active layer, the first source electrode, and the first drain electrode.

Further preferably, the switch TFT includes: a second bottom gate electrode disposed on the substrate; the insulating layer covering the second bottom gate electrode; the second active layer disposed on the insulating layer; a second source electrode and a second drain electrode disposed on the insulating layer and connected with two ends of the second active layer; and the planarization layer covering the second active layer, the second source electrode, and the second drain electrode; wherein the second source electrode connects with the first drain electrode.

Further preferably, the sensor TFT further includes a first top gate electrode disposed on the planarization layer and corresponding to the first active layer.

Further preferably, the optical-sensing device further includes a storage capacitance structure disposed on the substrate, the storage capacitance structure is electrically connected with the sensor TFT and/or the switch TFT.

Beneficial Effects

The present disclosure provides an optical-sensing device, a manufacturing method thereof, and a display panel. The optical-sensing device includes a sensor TFT disposed on a substrate and a switch TFT connected with the sensor TFT. The sensor TFT and the switch TFT include a first active layer and a second active layer, the first active layer includes a first IGZO layer and a perovskite layer disposed on the first IGZO layer, and the second active layer includes a second IGZO layer. Thus, the photoelectric conversion efficiency of the sensor TFT can be improved, the absorption of the light source by the switch TFT can be reduced, and the photoinduced leakage current can be decreased.

DESCRIPTION OF DRAWINGS

Following describes specific implementations of the present disclosure in detail with reference to accompanying drawings, which will make the technical solutions and other beneficial effects of the present disclosure obvious.

DETAILED DESCRIPTION OF EMBODIMENTS

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into protection scope of the present disclosure.

In the description of the present disclosure, it should be understood that, terms such as "first" and "second" are used herein for purposes of description, and should not be interpreted as indication or implication of relative importance, or implied indication of a number of the technical features. Therefore, features limited by terms such as "first" and "second" can explicitly or impliedly includes one or more than one these features. In the description of the present disclosure, "a plurality of" means two or more than two, unless otherwise specified.

In the present disclosure, unless specifically stated and defined otherwise, that a first feature is "on" or "under" a second feature may include: the first feature and the second feature are not in direct contact but are contacted by another feature between them. Furthermore, that the first feature is "on", "above", or "upon" the second feature includes that the first feature is directly above and obliquely above the second feature, or merely indicates that the first feature is higher in level than the second feature. That the first feature is "under" or "below" the second feature includes that the first feature is directly below and obliquely below the second feature, or merely indicates that the first feature is lower in level than the second feature.

The present disclosure provides an optical-sensing device.

Figure 1:
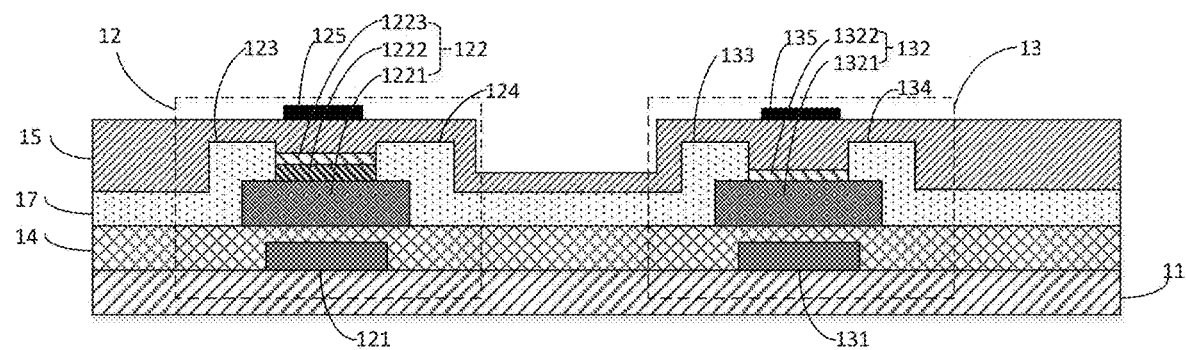
FIG. 1 is a schematic view of an optical-sensing device provided by an embodiment of the present disclosure.

Referring to FIG. 1, it is a schematic view of an optical-sensing device provided by an embodiment of the present disclosure. The optical-sensing device 10 includes a substrate 11 and a sensor thin film transistor (TFT) 12 and a switch TFT 13 disposed on the substrate 11. The sensor TFT 12 connects with the switch TFT 13.

In the embodiment, the sensor TFT 12 converts light signals of laser to electrical signals. The switch TFT 13 has a timing control function. A connection between the switch TFT 13 and the sensor TFT 12 can periodically control an outflow of signals generated by the sensor TFT 12. In other words, the signals generated by the laser are accumulated to a certain intensity before the switch TFT 13 is turned on, and then exported by the switch TFT 13. In this way, the electrical signal strength can be accumulated to a sufficient intensity and it is easier to be recognized.

In the embodiment, the sensor TFT 12 includes a first bottom gate electrode 121 disposed on the substrate 11, an insulating layer 14 covering the first bottom gate electrode 121, a first active layer 122 disposed on the insulating layer 14, a first source electrode 123 and a first drain electrode 124 disposed on the insulating layer 14 and connected with two ends of the first active layer 122, and a planarization layer 15 covering the first active layer 122, the first source electrode 123, and the first drain electrode 124. The switch TFT 13 includes a second bottom gate electrode 131 disposed on the substrate 11, the insulating layer 14 covering the second bottom gate electrode 131, a second active layer 132 disposed on the insulating layer 14, a second source electrode 133 and a second drain electrode 134 disposed on the insulating layer 14 and connected with two ends of the second active layer 132, and the planarization layer 15 covering the second active layer 132, the second source electrode 133, and the second drain electrode 134.

Wherein, a significant structure of the sensor TFT 12 for converting light signals of laser to electrical signals is the first active layer 122, which determines the photoelectric conversion capability. At present, three commonly used active layers are amorphous silicon (a-Si), indium gallium zinc oxide (IGZO), and low temperature poly-silicon (LTPS).

As the sensor TFT 12 and the switch TFT 13 are manufactured on the substrate 11 at a same time, and based on a same process, the active layers for producing actions in the sensor TFT 12 and the switch TFT 13 are preferably made of a same material. The study found that under a voltage applied to the gate electrode, the source electrode, and the drain electrode, a carrier mobility is LTPS>IGZO>a-Si, that is, a transmission speed and switching performance of the switch TFT 13 are LTPS>IGZO>a-Si, and the photoelectric conversion efficiency of the sensor TFT 12 is LTPS>IGZO>a-Si. The active layer of the sensor TFT 12 needs to have as high photoelectric conversion efficiency as possible, but the active layer of the switch TFT 13 needs to reduce the absorption of the light source as much as possible and decrease the photoinduced leakage current. At the same time, IGZO is selected as the active layer because of its good overall uniformity in large-sized panels, relatively moderate price costs, and its obvious advantages in application for display devices with larger areas. Based on the IGZO active layer, the transmission speed and switching performance of the switch TFT 13 can be satisfied, as well as the low absorption intensity of the light source. However, for the sensor TFT 12, when the IGZO acts as the active photosensitive layer, the photoelectric conversion efficiency is poor. This is because the IGZO has a small wavelength absorption range for the light source, and the IGZO as an active layer produces fewer carriers when receiving laser irradiation, so the laser cannot be converted into electrical signals efficiently. Therefore, it is necessary to improve the absorption intensity of the IGZO-based active layer for the light source.

In the embodiment, the second active layer 132 includes a second IGZO layer 1321, and the first active layer 122 includes a first IGZO layer 1221 and a perovskite layer 1222 disposed on the first IGZO layer 1221. Wherein, the perovskite layer 1222 may be MAPbI3g perovskite. Through a special process (described in a manufacturing process below), introducing perovskite layer 1222 into the first active layer 122 can widen the wavelength range and intensity of IGZO absorption, and significantly improve the photoelectric conversion efficiency of the sensor TFT 12.

Preferably, the first active layer 122 may further include a first graphene layer 1223 disposed on the perovskite layer 1222 and a first top gate electrode 125 disposed on the planarization layer 15 and corresponding to the first active layer 122. Wherein, the first graphene layer 1223 is double-layered. By applying a voltage from the first top gate electrode 125 to the first graphene layer 1223, a band gap of the first active layer 122 can be changed, that is, the band gap of the first active layer 122 can be adjustable as required.

Preferably, the second active layer 132 may further include a second graphene layer 1322 disposed on the second IGZO layer 1321 to increase conductivity of the second active layer 132. In the embodiment, a second top gate electrode 135 may be added and disposed on the planarization layer 15 and corresponding to the second active layer 132, thereby achieving double gate voltage control.

In some embodiments, the optical-sensing device 10 may further include a storage capacitance structure (not shown in FIG. 1) disposed on the substrate 11. The storage capacitance structure (CST) is electrically connected with the sensor TFT 12 and/or the switch TFT 13, that is, the CST may be individually connected with the sensor TFT 12 or the switch TFT 13, alternatively, the CST may be connected with both of the sensor TFT 12 and the switch TFT 13, and there is no restriction on connection modes between the CST and the two TFTs. As a storage capacitor, the CST can store charge and release the charge when it needs to be released, which can improve the signal release intensity.

The optical-sensing device 10 provided by the embodiment of the present disclosure introduces a perovskite layer 1222 above the IGZO layer (the first IGZO layer 1221) of the sensor TFT 12, which can significantly improve the photoelectric conversion efficiency of the first active layer 122 of the sensor TFT 12. At the same time, the double-layered graphene (the first graphene layer 1223) can be introduced into the first active layer 122, and adjustable characteristics of the band gap of the double-layered graphene can be used to change the band gap of the graphene when a voltage is applied on the first top gate electrode 125, so that the light absorption band of the sensor TFT 12 can be adjusted according to requirements.

The embodiment of the present disclosure further provides a manufacturing method of the above optical-sensing device 10, so the structure labels in FIG. 1 is continued to be referenced.

Figure 2:
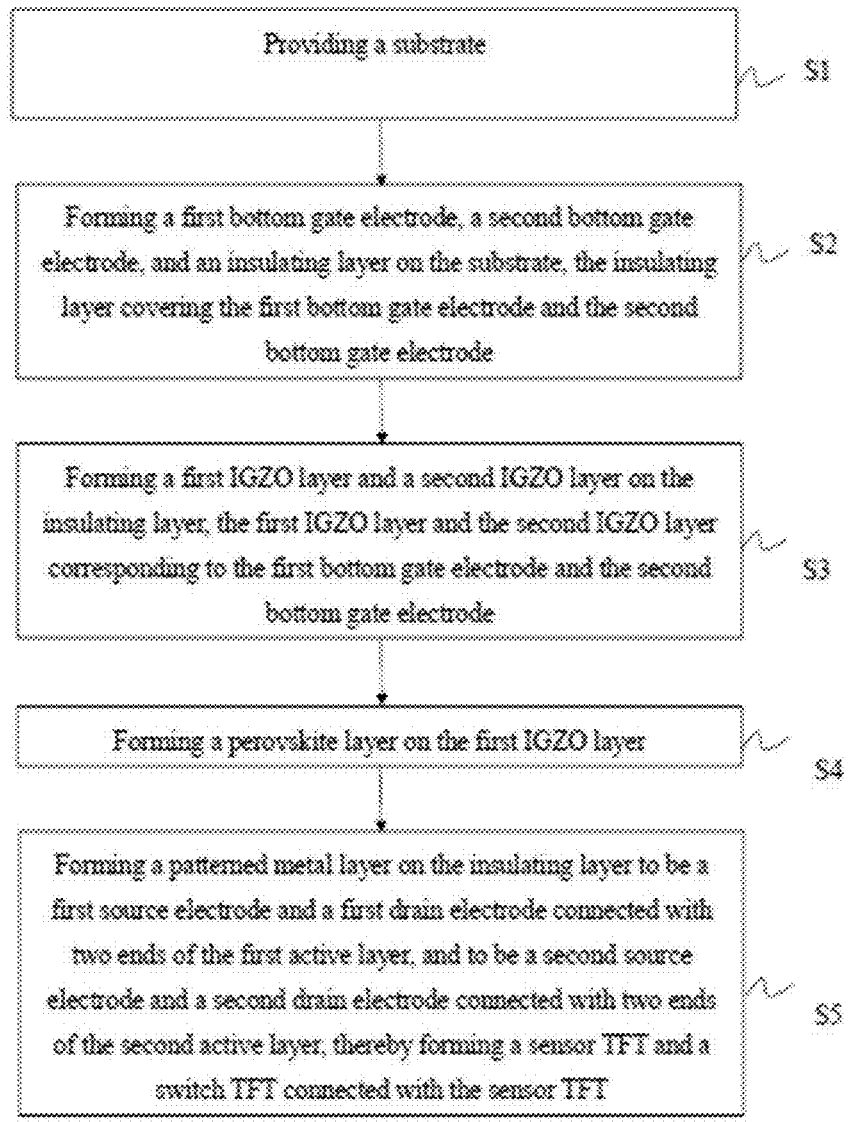
FIG. 2 is a flow chart of a manufacturing method of the optical-sensing device provided by the embodiment of the present disclosure.
Figure 3:
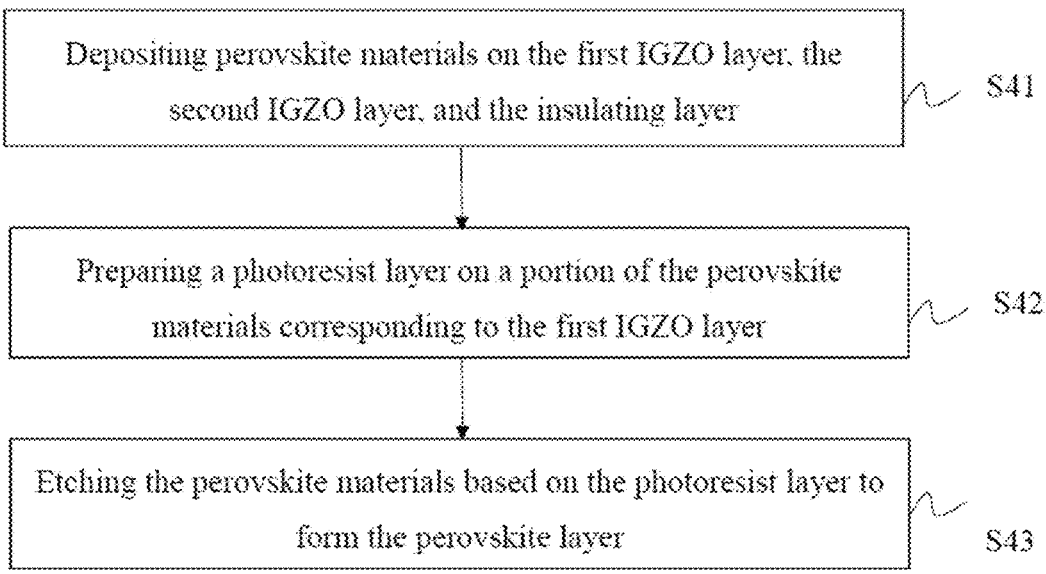
FIG. 3 is a flow chart of a manufacturing method of a perovskite layer provided by the embodiment of the present disclosure.

Referring to FIG. 2 at the same time, it is a flow chart of a manufacturing method of the optical-sensing device provided by the embodiment of the present disclosure. The manufacturing method of the optical-sensing device 10 includes steps S1-S5 as below.

Step S1: providing a substrate 11.

The substrate 11 may be a glass substrate or be made of other transparent materials.

Step S2: forming a first bottom gate electrode 121, a second bottom gate electrode 131, and an insulating layer 14 on the substrate 11, the insulating layer 14 covering first bottom gate electrode 121 and second bottom gate electrode 131.

In the embodiment, the first bottom gate electrode 121 and the second bottom gate electrode 131 may be made of a same metal material, such as Cr, W, Ti, Ta, Mo, Al, Cu, and other metals. Specifically, the above metal may be deposited through physical vapor deposition (PVD), then the first bottom gate electrode 121 and the second bottom gate electrode 131 are obtained through coating photoresist, exposure, development, and etching process, and lastly the insulating layer 14 covering the first bottom gate electrode 121 and the second bottom gate electrode 131 is formed through chemical vapor deposition (CVD).

Step S3: forming a first IGZO layer 1221 and a second IGZO layer 1321 on the insulating layer 14, the first IGZO layer 1221 and the second IGZO layer 1321 corresponding to the first bottom gate electrode 121 and the second bottom gate electrode 131.

Wherein, manufacturing methods of the first IGZO layer 1221 and the second IGZO layer 1321 are same as manufacturing methods of the first bottom gate electrode 121 and the second bottom gate electrode 131, except that the materials are IGZO.

Step S4: forming a perovskite layer 1222 on the first IGZO layer 1221.

In an embodiment, the first IGZO layer 1221 and the perovskite layer 1222 constitute the first active layer 122, the second IGZO layer 1321 constitutes the second active layer 132.

In another embodiment, after step S4, the manufacturing method may further include forming a first graphene layer 1223 on the perovskite layer 1222. Thus, the first IGZO layer 1221, the perovskite layer 1222, and the first graphene layer 1223 constitute the second active layer 132. Wherein, the perovskite layer 1222 may be MAPbI3g perovskite. A second graphene layer 1322 may also be formed on the second IGZO layer 1321 at the same time.

Figure 4A:
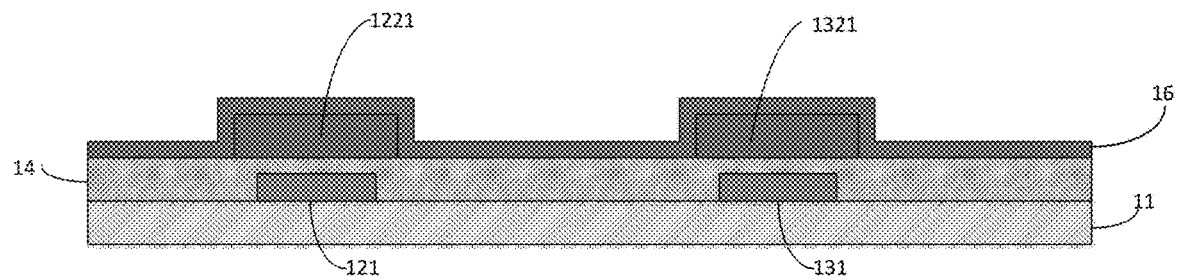
FIG. 4A to FIG. 4C are schematic views of structures during the manufacturing method of the perovskite layer provided by the embodiment of the present disclosure.
Figure 4B:
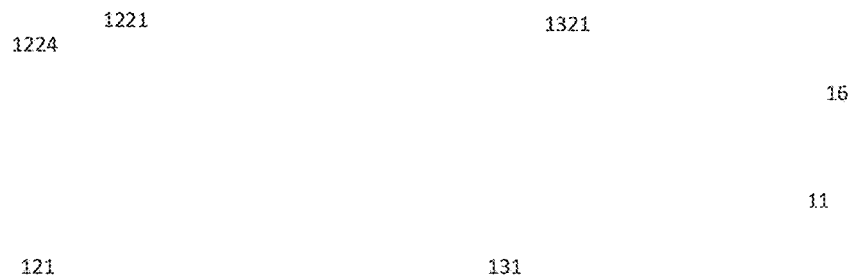
Figure 4C:
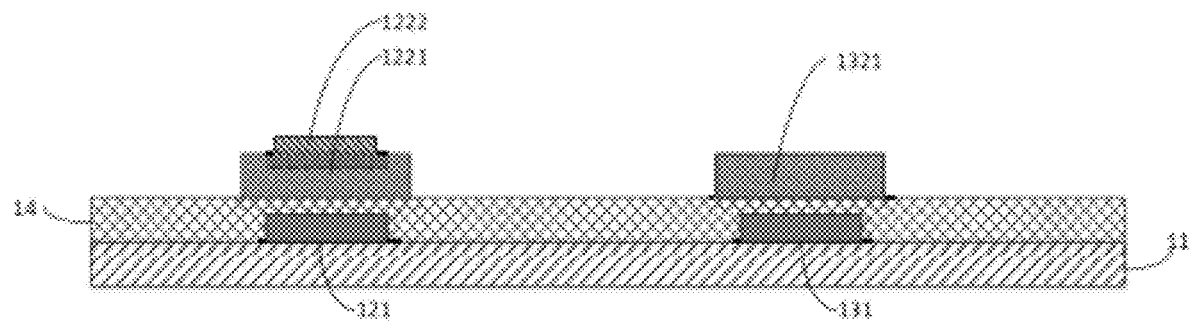

Specifically, referring to FIG. 3 and FIGS. 4A-4C, FIG. 3 is a flow chart of a manufacturing method of a perovskite layer provided by the embodiment of the present disclosure. FIG. 4A to FIG. 4C are schematic views of structures during the manufacturing method of the perovskite layer provided by the embodiment of the present disclosure. The step S4 for forming the perovskite layer 1222 includes following steps.

Step S41: depositing perovskite materials 16 on the first IGZO layer 1221, the second IGZO layer 1321, and the insulating layer 14.

Any of the above deposition methods can be used to complete the step S41. A completed structure of the step S41 is shown in FIG. 4A.

Step S42: preparing a photoresist layer 1224 on a portion of the perovskite materials 16 corresponding to the first IGZO layer 1221.

As shown in FIG. 4B, a mask can be used over the perovskite materials 16 to form the photoresist layer 1224 corresponding to the first IGZO layer 1221.

Step S43: etching the perovskite materials 16 based on the photoresist layer 1224 to form the perovskite layer 1222.

Wherein, portions of the perovskite materials 16 without covering the photoresist layer 1224 are etched, and the portion of the perovskite materials 16 below the photoresist layer 1224 is retained to form the perovskite layer 1222, and then the photoresist layer 1224 is removed.

A completed structure of the step S43 is shown in FIG. 4C.

Step S5: forming a patterned metal layer 17 on the insulating layer 14 to be a first source electrode 123 and a first drain electrode 124 connected with two ends of the first active layer 122, and to be a second source electrode 133 and a second drain electrode 134 connected with two ends of the second active layer 132, thereby forming a sensor TFT 12 and a switch TFT 13 connected with the sensor TFT 12.

In the embodiment, a metal layer may be deposited on the insulating layer 14, the first active layer 122, and the second active layer 132, and then the metal layer forms the patterned metal layer 17 by photolithographic process. Among them, those connected with two ends of the first active layer 122 are the first source electrode 123 and the first drain electrode 124, and those connected with two ends of the second active layer 132 are the second source electrode 133 and the second drain electrode 134, and the first drain electrode 124 connects with the second source electrode 133, thereby conducting the sensor TFT 12 and the switch TFT 13 to make electrical signals of the sensor TFT 12 flow to the switch TFT 13 and make the switch TFT 13 periodically control the electrical signals to flow to a display area (not shown in figures).

The manufacturing method of the optical-sensing device may further include forming a planarization layer 15 covering the patterned metal layer 17, the first active layer, and the second active layer. The manufacturing method of the optical-sensing device may further include forming a first top gate electrode 125 on the planarization layer 15 and corresponding to the first active layer 122. The manufacturing method of the optical-sensing device may further include forming a second top gate electrode 135 on the planarization layer 15 and corresponding to the second active layer 132.

The manufacturing method of the optical-sensing device provided by the embodiment of the present disclosure adopts a special photolithography process to form a perovskite layer 1222 on the first IGZO layer 1221 to improve the photoelectric conversion efficiency of the optical-sensing device 10. A first graphene layer 1223 is formed on the perovskite layer 1222, thereby making the band gap of the first active layer 122 of the sensor TFT 12 be adjustable, so the band of light absorption can be adjusted according to requirements. In addition, in the manufacturing process of the perovskite layer 1222, the perovskite material was not formed on the second active layer 132 of the switch TFT 13, which can reduce the absorption of light source by the switch TFT 13 and reduce photoinduced electric leakage.

The embodiment of the present disclosure further provides a display panel 20 including the above optical-sensing device 10.

Figure 5:
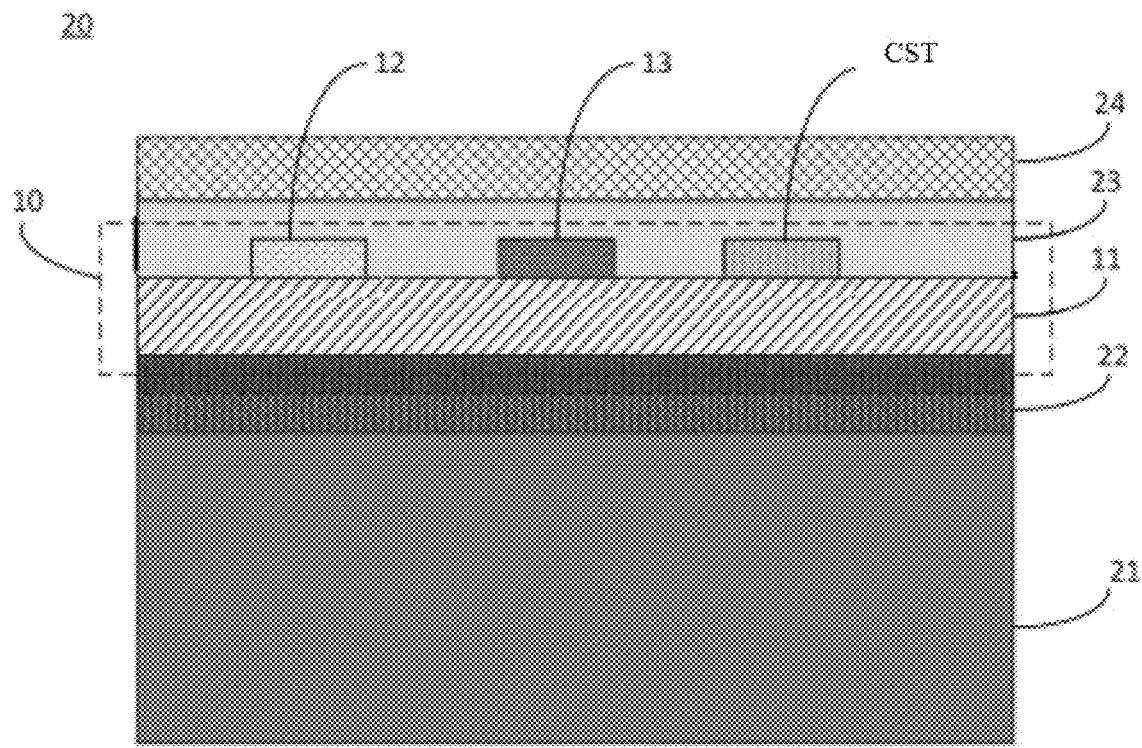
FIG. 5 is a schematic view of a display panel provided by the embodiment of the present disclosure.

Referring to FIG. 5, it is a schematic view of a display panel provided by the embodiment of the present disclosure. The display panel 20 includes a liquid crystal display (LCD) panel 21 and the optical-sensing device 10 disposed on the liquid crystal display panel 21 (open cell). The LCD panel 21 includes an array substrate, a color filter substrate, and a color resistance layer and a liquid crystal layer sandwiched between the array substrate and the color filter substrate. These are normal settings for the LCD panel and are not shown in FIG. 5. Among them, the optical-sensing device 10 is connected to the LCD panel 21 through a first laminating glue 22, and the display panel 20 further includes a cover plate 24 connected with the optical-sensing device 10 through a second laminating glue 23.

In the embodiment, the sensor TFT 12 with light-sensitive function on an entire surface is distributed on the substrate 11. The sensor TFT 12 and the switch TFT 13 can control a plurality of display areas. It should be noted that, the sensor TFT 12 and the switch TFT 13 are actually connected as shown in FIG. 1. As an overall structure is shown in FIG. 5, the connection relationship is not shown. Wherein, FIG. 5 also shows the storage capacitance structure CST mentioned above, and its connections with the sensor TFT 12 and the switch TFT 13 are also not shown in FIG. 5.

The display panel 20 provided in the embodiment of the present disclosure integrates the laser sensing function in the display panel 20, so that the LCD device can sense external laser light and transmit the sensed laser signal to the display device. The LCD device generates a corresponding signal at the laser scanning position to indicate color changes in the corresponding position of the LCD device.

The description of the above embodiments is only used to help understand the technical solution of the present disclosure and its core ideas; it will be understood by those of ordinary skill in the art that the technical solutions described in the foregoing embodiments may be modified or equivalently substituted for some or all of the technical features, and the modifications or substitutions do not depart from the scope of the technical solutions of the embodiments of the present disclosure.

What is claimed is:

1. An optical-sensing device, comprising:
   a substrate;
   a sensor thin film transistor (TFT) disposed on the substrate, the sensor TFT comprising a first active layer; and
   a switch TFT disposed on the substrate and connected with the sensor TFT, the switch TFT comprising a second active layer;
   wherein the first active layer comprises a first indium gallium zinc oxide (IGZO) layer, a perovskite layer disposed on the first IGZO layer, and a first graphene layer disposed on the first IGZO layer; and the second active layer comprises a second IGZO layer.

2. The optical-sensing device in claim 1, wherein the second active layer further comprises a second graphene layer disposed on the second IGZO layer.

3. The optical-sensing device in claim 1, wherein the sensor TFT comprises:
   a first bottom gate electrode disposed on the substrate;
   an insulating layer covering the first bottom gate electrode;
   the first active layer disposed on the insulating layer;
   a first source electrode and a first drain electrode disposed on the insulating layer and connected with two ends of the first active layer; and
   a planarization layer covering the first active layer, the first source electrode, and the first drain electrode.

4. The optical-sensing device in claim 3, wherein the switch TFT comprises:
   a second bottom gate electrode disposed on the substrate;
   the insulating layer covering the second bottom gate electrode;
   the second active layer disposed on the insulating layer;
   a second source electrode and a second drain electrode disposed on the insulating layer and connected with two ends of the second active layer; and
   the planarization layer covering the second active layer, the second source electrode, and the second drain electrode;
   wherein the second source electrode connects with the first drain electrode.

5. The optical-sensing device in claim 3, wherein the sensor TFT further comprises a first top gate electrode disposed on the planarization layer and corresponding to the first active layer.

6. The optical-sensing device in claim 1, further comprising a storage capacitance structure disposed on the substrate, wherein the storage capacitance structure is electrically connected with the sensor TFT and/or the switch TFT.

7. A display panel, comprising a liquid crystal display panel and an optical-sensing device disposed on the liquid crystal display panel, the optical-sensing device comprising:
   a substrate;
   a sensor TFT, disposed on the substrate and comprising a first active layer; and
   a switch TFT, disposed on the substrate, connected with the sensor TFT, and comprising a second active layer;
   wherein the first active layer comprises a first indium gallium zinc oxide (IGZO) layer, a perovskite layer disposed on the first IGZO layer, and a first graphene layer disposed on the first IGZO layer; and the second active layer comprises a second IGZO layer.

8. The display panel in claim 7, wherein the second active layer further comprises a second graphene layer disposed on the second IGZO layer.

9. The display panel in claim 7, wherein the sensor TFT comprises:
   a first bottom gate electrode disposed on the substrate;
   an insulating layer covering the first bottom gate electrode;
   the first active layer disposed on the insulating layer;
   a first source electrode and a first drain electrode disposed on the insulating layer and connected with two ends of the first active layer; and
   a planarization layer covering the first active layer, the first source electrode, and the first drain electrode.

10. The display panel in claim 9, wherein the switch TFT comprises:
    a second bottom gate electrode disposed on the substrate;
    the insulating layer covering the second bottom gate electrode;
    the second active layer disposed on the insulating layer;
    a second source electrode and a second drain electrode disposed on the insulating layer and connected with two ends of the second active layer; and
    the planarization layer covering the second active layer, the second source electrode, and the second drain electrode;
    wherein the second source electrode connects with the first drain electrode.

11. The display panel in claim 9, wherein the sensor TFT further comprises a first top gate electrode disposed on the planarization layer and corresponding to the first active layer.

12. The display panel in claim 7, further comprising a storage capacitance structure disposed on the substrate, wherein the storage capacitance structure is electrically connected with the sensor TFT and/or the switch TFT.

13. An optical-sensing device, comprising:
    a substrate;
    a sensor thin film transistor (TFT) disposed on the substrate, the sensor TFT comprising a first active layer; and
    a switch TFT disposed on the substrate and connected with the sensor TFT, the switch TFT comprising a second active layer;
    wherein the first active layer comprises a first indium gallium zinc oxide (IGZO) layer and a perovskite layer disposed on the first IGZO layer, and the second active layer comprises a second IGZO layer and a second graphene layer disposed on the second IGZO layer.

14. The optical-sensing device in claim 13, wherein the sensor TFT comprises:
    a first bottom gate electrode disposed on the substrate;
    an insulating layer covering the first bottom gate electrode;
    the first active layer disposed on the insulating layer;
    a first source electrode and a first drain electrode disposed on the insulating layer and connected with two ends of the first active layer; and
    a planarization layer covering the first active layer, the first source electrode, and the first drain electrode.

15. The optical-sensing device in claim 14, wherein the switch TFT comprises:
    a second bottom gate electrode disposed on the substrate;
    the insulating layer covering the second bottom gate electrode;
    the second active layer disposed on the insulating layer;
    a second source electrode and a second drain electrode disposed on the insulating layer and connected with two ends of the second active layer; and the planarization layer covering the second active layer, the second source electrode, and the second drain electrode;

wherein the second source electrode connects with the first drain electrode.

16. The optical-sensing device in claim 14, wherein the sensor TFT further comprises a first top gate electrode disposed on the planarization layer and corresponding to the first active layer.

17. The optical-sensing device in claim 13, further comprising a storage capacitance structure disposed on the substrate, wherein the storage capacitance structure is electrically connected with the sensor TFT and/or the switch TFT.

\* \* \* \* \*